Figure 1:
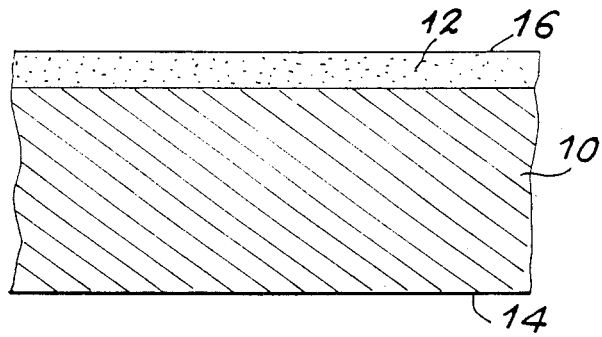

United States Patent [19]

Deroux-Dauphin et al.

[11] Patent Number: 4,964,212
[45] Date of Patent: Oct. 23, 1990

[54] PROCESS FOR PRODUCING ELECTRICAL CONNECTIONS THROUGH A SUBSTRATE

[75] Inventors: Patrice Deroux-Dauphin; Henri Sibuet, both of Saint Egreve; Thierry Dupeux, Saint Martin d'Heres, all of France

[73] Assignees: Commissariat a l'Energie Atomique, Paris; Compagnie Europeenne de Composants Electroniques LCC, Courbevoie, both of France

[21] Appl. No.: 404,410

[22] Filed: Sep. 8, 1989

[30] Foreign Application Priority Data

Sep. 29, 1988 [FR] France ............... 88 12750

[51] Int. Cl.⁵ ............................ H01K 3/10
[52] U.S. Cl. ....................... 29/852; 204/15; 219/121.68; 219/121.69; 437/173
[58] Field of Search ............ 29/852; 204/15; 174/68.5; 437/173; 219/121.68, 121.69

[56] References Cited

U.S. PATENT DOCUMENTS 3,526,009 2/1971 Cranston et al. ............ 174/68.5 X
4,348,253 9/1982 Subbarao et al. .
4,417,393 11/1983 Becker ........................ 174/68.5 X
4,642,160 2/1987 Burgess ....................... 29/852 X
4,842,699 6/1989 Hua et al. ................... 204/15

FOREIGN PATENT DOCUMENTS 0164564 12/1985 European Pat. Off. .
2548258 5/1977 Fed. Rep. of Germany ........ 29/852

OTHER PUBLICATIONS

IBM Technical Disclosure Bulletin, vol. 15, No. 2, "Kerf Oxide Trench for Laser Dicing", T. Bkaer et al., Jul. 1972.
Electronics International, vol. 55, No. 11, "Laser Drills 5-mil Blind Vias", Jerry Lyman, Jun. 1982, p. 48.

Primary Examiner—Carl E. Hall
Assistant Examiner—Carl J. Arbes
Attorney, Agent, or Firm—Oblon, Spivak, McClelland, Maier & Neustadt

[57] ABSTRACT

According to the invention, blind holes (27) and not through-holes are produced. For this purpose, the substrate (10) to be pierced or perforated is previously covered with a layer (12) less absorbing for the laser perforating beam (26) than the substrate.

Application to the production of electronic circuits, magnetic recording devices, etc.

10 Claims, 2 Drawing Sheets

PROCESS FOR PRODUCING ELECTRICAL CONNECTIONS THROUGH A SUBSTRATE

The present invention relates to a process for producing electrical connections through a substrate. It is used in the production of integrated circuits or devices intended for magnetic recording and more generally in microelectronics and optoelectronics.

For producing magnetic recording devices, European patent EP-A-269 489 describes a magnetic head constituted by a substrate on one of whose faces is located a reading and writing head and on whose other face are located integrated circuits. "Intraconnections" are then formed between the head and the circuits through the substrate.

In order to produce such intraconnections, complete perforation takes place of the substrate and the holes produced are used for making an electrical connection between the two substrate faces.

In general terms, the perforation or piercing of a substrate can be carried out by chemical etching or by dry etching. However, these two methods both suffer from disadvantages. As the first is isotropic, it leads to equal lateral and vertical etching speeds, which does not make it possible to obtain holes having a small diameter and a large depth. The second of these methods causes problems in connection with the discharge of the materials formed beyond 50 $\mu$m, which reduces the etching speed. However, even in the case of limited depths, the etching speed remains low (approximately 0.5 micron/minute), which leads to etching times of several hours.

With the event of the laser, another way of making holes in substrates has been provided. The considerable flexiblity of regulating the focussing of a laser beam, combined with the possibility of regulating the duration and power of the laser pulse have made the laser an effective means for making small diameter holes.

Such a procedure is e.g. described in U.S. Pat. No. 4,437,109 granted on Mar. 13, 1984 to T. R. ANTHONY et al for "Silicon-on-Sapphire Body with Conductive Paths Therethrough".

The use of a laser makes it possible to obtain the extreme precision required in the positioning of the holes, when it is a question of interconnecting integrated circuits and which must be of the same order of magnitude as that of the machines producing patterns on said circuits. Once the holes have been obtained, they are metallized and contacts are formed on each of the substrate faces.

However, this procedure still suffers from disadvantages. Thus, the semiconductor material wafers or plates forming the substrate must be manipulated for supplementary operations of producing several circuits. In accordance with the procedure used in most microelectronics equipments, this manipulation takes place by suction. However, when a plurality of holes are made in such wafers, it is not possible to use suction and then another handling means has to be provided. Moreover, piercing by laser leads to the projection of pulverized materials, which may cause short circuits or abnormalities in the circuits.

The object of the present invention is to obviate these disadvantages. It therefore proposes a process not causing problems with the procedure of handling the perforated wafers by suction and which obviates projection risks.

According to the invention this objective is achieved in the following way. Prior to perforating the substrate with the aid of a laser beam, the substrate is covered with at least one layer of material with an absorption coefficient at the wavelength of the laser beam below that of the substrate. The perforating operation then preferably takes place by the face opposite to that covered by said layer. If the substrate is then perforated under the effect of the laser beam, as in the prior art, the layer covering the substrate is traversed without damage by the beam, so that the hole finally obtained in the wafer is closed by the layer. In other words, a blind hole is obtained.

As the wafer or plate is not completely perforated or pierced, it can easily be manipulated by suction. Moreover, there is no material projection on the layer side, because the layer closes the hole.

More specifically, the present invention relates to a process for the production of electrical connections through a substrate, in which holes are made in the substrate by using a laser beam and electrical connections are produced through the substrate by following the thus made holes, characterized in that, prior to the perforation of the substrate, on a first face thereof is deposited at least one thin layer of a material having an absorption coefficient at the wavelength of said laser beam lower than that of the substrate and exposure takes place to the said laser beam, the holes made then being blind and only affecting the substrate.

In order to improve the efficiency of the process, several material layers having different absorption coefficients below that of the substrate can be used. It is also possible to use a layer transparent to the laser beam.

The various connnection are then obtained according to known procedures, by partly or completely filling the blind holes with a conductive material and then making the appropriate contacts with the connections made on the two wafer faces.

With regards to the electrical properties of the materials used, all combinations are possible and in particular the use of a conductor or semiconductor substrate with an insulating layer, or that of an insulating substrate with a conductive layer.

When the layer is conductive, the bottom of the blind hole constitutes a conductor element, which is in contact with the metal layer deposited in the blind hole, so that contact is immediately obtained.

When the layer is insulating, it is necessary at some time to perforate the bottom of the hole, i.e. the layer. This perforation can be carried out at the end of the process adopting any known means, such as etching.

The invention is described in greater detail hereinafter relative to non-limitative embodiments and the attached drawings, wherein show:

FIG. 1 A substrate covered with a layer having an absorption coefficient lower than that of the substrate.

Figure 2:
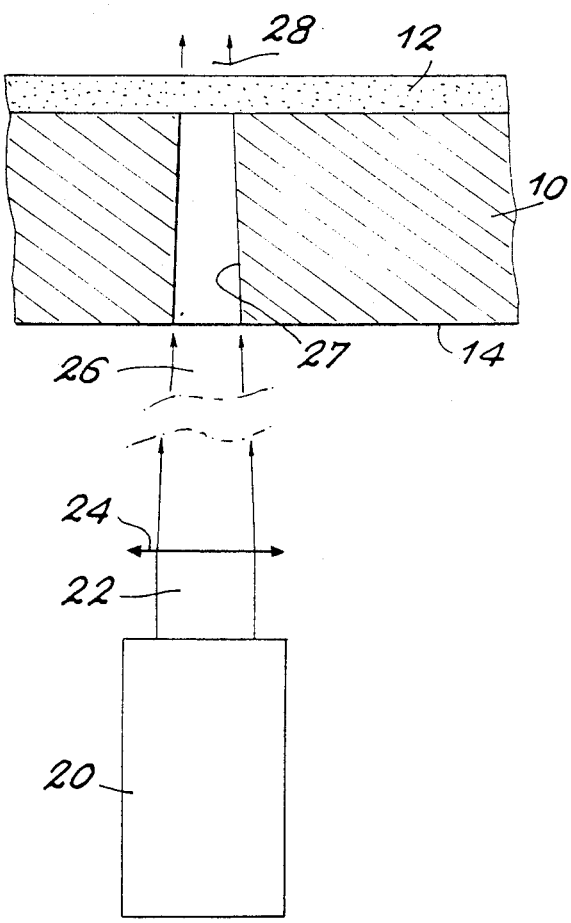

FIG. 2 The perforation operation.

FIGS. 3 to 6 Four stages in the production of intraconnections in the case where the substrate is semiconducting and the layer insulating.

Figure 7:
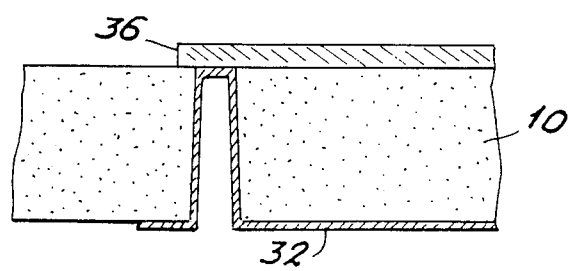

FIG. 7 A variant corresponding to the case where the substrate in insulating and the layer conducting.

FIG. 1 shows a substrate 10 on which has been deposited a layer 12 of a material having an absorption coefficient at the wavelength of the radiation of the laser used below that of the substrate. The thus obtained wafer or plate has a "rear" face 14 and a "front" face 16.

For example, substrate 10 can be of silicon and layer 12 of silica ($SiO_2$). In this case, the silica layer 12 can be obtained by thermal vapour phase growth or by plasma deposition—however, any other process is also possible.

With regards to the thickness, it is e.g. possible to use a 500 to 800 μm thick substrate and a 0.5 to 4 μm layer. However, it is pointed out that the attached drawings are not to scale for reasons of clarity. FIG. 2 illustrates the production of the blind holes according to the invention. A laser 20 emits a beam 22, which is focused by a means 24 and then directed onto the rear wafer face 14. The laser is chosen in such a way that the material 10 is absorbent at the emitted wavelength. This choice does not cause any problem at present. When the substrate is semiconducting, a power laser, whereof the photon energy is above the forbidden band width Eg of the material, can prove suitable (the absorption coefficient being a function of the forbidden band width). Particularly in the case of silicon ($Eg = 1.1$ eV) a Nd-YAG laser emitting at 1.06μm (1.32 eV) is perfectly suitable. This laser can advantageously operate in the Q-switched mode. The aforementioned U.S. patent gives the use conditions for such a laser and they can be reproduced in the present invention.

Layer 12 must have an absorption coefficient below that of silicon for the wavelength used, which is precisely the case with silica, when the wavelength is 1.06 μm. The absorption coefficient of silicon at the wavelength 1.06 μm is approximately $10^3$ cm$^{-1}$ and that of silica at this wavelength is below 1 cm$^{-1}$.

The focused beam 26 striking the rear face 14 perforates the substrate (a laser pulse train being necessary for this purpose). The hole 27 obtained substantially corresponds to the diameter of the focused optical beam. At its entrance, the hole has a diameter of a few dozen microns. The hole finally obtained is slightly conical and can have a diameter of about 10 microns at the closed end.

These diameters can clearly be reduced in the case of improved focusing means.

When the beam reaches layer 12, it is only very slightly absorbed and passes through the said layer without perforating it to form an emergent beam 28. The perforation of such a blind hole takes 1 to 10 milliseconds.

The wafer perforated with such blind holes can then be treated by traditional means in order to produce the actual intraconnections. FIGS. 3 to 6 illustrate a number of stages in a non-limitative manner, where substrate 10 is assumed to be conducting (e.g. of silicon) and layer 12 insulating (e.g. of $SiO_2$).

Figure 3:
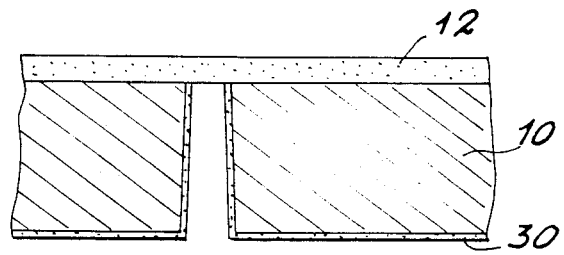

Thus, FIG. 3 shows an insulating layer 30 deposited on the walls and edges of the hole. It is possible to obtain this layer by thermal oxidation or by LPCVD.

Figure 4:
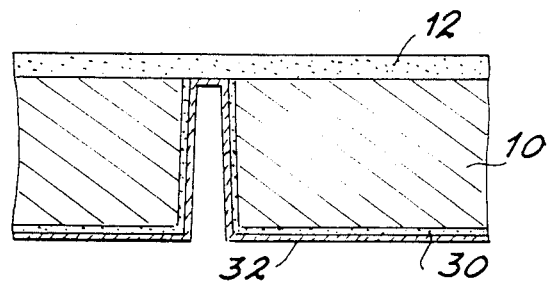
Figure 5:
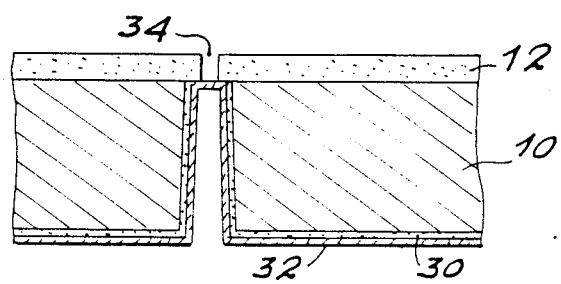

FIG. 4 shows a conductive layer 32 deposited on the inner walls of the hole previously covered with the aforementioned layer 30. The conductive layer also extends over the edges of the hole. This layer can be deposited by vapour phase deposition or electrolytically.

It is also possible to completely fill the blind hole with conductive material (Cu, Fe, Ni, etc.) by electrolysis or electrolytic plating.

In order to permit contact with the metal layer 32, the bottom of the blind hole is perforated. Opening 34 is made by masking and etching layer 12.

Figure 6:
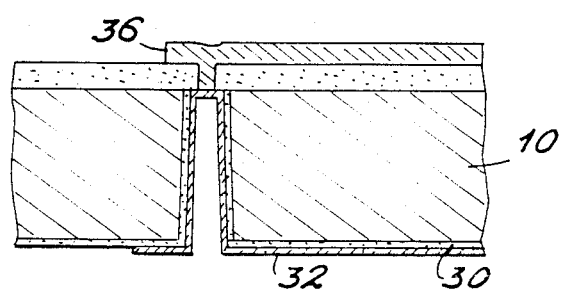

The patterns of connections can then be defined on the two faces of the wafer with the contact means 36 on the front face and appropriate etching of layer 32 (FIG. 6).

FIG. 7 illustrates another embodiment of the process according to the invention in the case where substrate 10 is insulating and layer 12 conducting. In this case, the insulating layer 30 of FIGS. 3 to 6 serves no purpose and the conductive layer 32 can be directly deposited on the walls of the hole. Moreover, as layer 12 is condutive, it directly ensures the contact 36 with layer 32.

Conductive, transparent materials suitable for this application are e.g. ITO (indium and tin oxide), i.e., InSnO, InSn, $SnO_2$, $In_2O_3SnO_2$, which transmit radiation with a wavelength above 400 nm.

We claim:

1. Process for the production of electrical connections through a substrate comprising the steps of:
   depositing at least one thin layer (12) of material on the substrate (10), the material of the at least one thin layer (12) being only slightly absorbent of a laser beam (26) such that the laser beam (26) passes through the at least one thin layer (12) without perforating the material to form an emergent beam (28) after passing therethrough;
   exposing the substrate (10) with the at least one thin layer (12) material to the laser beam (26), the laser beam (26) being at least partially absorbed by the substrate (10) to drill a hole only in the substrate (10), the laser beam (26) passing through the at least one thin layer (12) of material withous perforation thereof to form a blind hole in the substrate (10) having a bottom formed substantially by the at least one thin layer (12) of material; and
   forming electrical connections through the substrate (10) using the hole formed by the laser beam (26).

2. Process according to claim 1, wherein the substrate (10) is at least one conducting and semiconducting and the at least one thin layer of material is (12) insulating.

3. Process according to claim 2, wherein the substrate (10) is of silicon.

4. Process according to claim 2, wherein the at least one thin layer of material (12) is made of silica.

5. Process according to claim 2, wherein following the drilling of the hole (27), an insulating layer (30) is deposited on walls of the hole.

6. Process according to claim 1, wherein substrate (10) is insulating and the at least one thin layer of material is (12) conducting.

7. Process according to claim 6, wherein the conducting layer (12) is of a material chosen from within the group consisting of InSnO, InSn, $SnO_2$ and $In_2O_3SnO_2$.

8. Process according to claim 6, wherein the conducting layer (12) is etched and serves as a contact means (36).

9. Process according to either of the claims 5 and 6, wherein a conductive material (32) is deposited in at least part of the hole.

10. Process according to claim 8, wherein as the layer is insulating, it is etched right through facing the hole and wherein contacts are produced on said layer.

* * * * *